Figure 1:
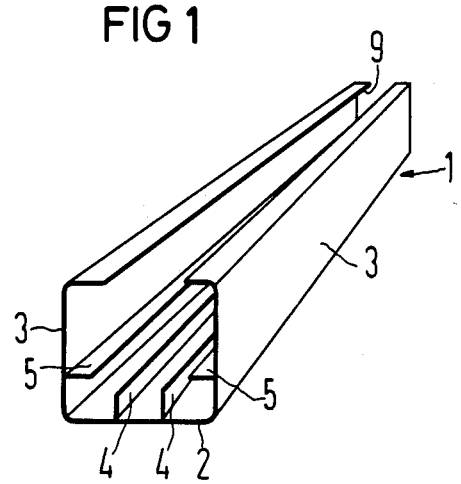

United States Patent [19]

Hofmann et al.

[11] Patent Number: 4,752,005
[45] Date of Patent: Jun. 21, 1988

[54] STORAGE TRAY FOR SEMIFINISHED AND FINISHED PRODUCTS, PARTICULARLY FOR ELECTRIC PIN COIL FORMS

[75] Inventors: Max Hofmann, Taufkirchen; Gerhard Meindl, Alling, both of Fed. Rep. of Germany

[73] Assignee: Siemens Aktiengesellschaft, Berlin and Munich, Fed. Rep. of Germany

[21] Appl. No.: 521,706

[22] Filed: Aug. 9, 1983

[30] Foreign Application Priority Data

Aug. 12, 1982 [DE] Fed. Rep. of Germany ....... 3230075

[51] Int. Cl.⁴ .............................................. B65D 73/02
[52] U.S. Cl. .................................... 206/334; 206/328
[58] Field of Search ............... 206/328, 329, 330, 331, 206/334, 483, 477

[56] References Cited

U.S. PATENT DOCUMENTS

| 782,817 | 2/1905 | Beiser | 206/483 |
|---|---|---|---|
| 3,129,569 | 4/1964 | Ballantyne | 206/477 |
| 3,454,921 | 7/1969 | Coleman et al. | 206/331 |
| 3,892,312 | 7/1975 | Tems | 206/328 |
| 4,171,049 | 10/1979 | Noltara et al. | 206/334 |
| 4,371,078 | 2/1983 | Hunt et al. | 206/329 |

FOREIGN PATENT DOCUMENTS

| 3129138 | 3/1982 | Fed. Rep. of Germany | 206/334 |
|---|---|---|---|
| 1309342 | 3/1973 | United Kingdom | 206/338 |
| 2081226 | 2/1982 | United Kingdom | . |

Primary Examiner—Joseph M. Moy
Attorney, Agent, or Firm—Herbert L. Lerner; Laurence A. Greenberg

[57] ABSTRACT

Tray for semifinished and finished products serving both as a transport tray for the semifinished products as well as a packaging tray for the finished products, including a profiled rail having a tunnel-like cross section with a tunnel floor and side walls, mutually parallel ridge-like supports for the products formed on the tunnel floor in spaced relationship with the side walls, and ridges formed on inner surfaces of the side walls of the profiled rail in spaced relationship with the tunnel floor for securing products, received in the profiled rail with portions thereof disposed between the supports and the ridges, against shifting in direction transverse to the tunnel floor.

5 Claims, 1 Drawing Sheet

U.S. Patent  Jun. 21, 1988  4,752,005

STORAGE TRAY FOR SEMIFINISHED AND FINISHED PRODUCTS, PARTICULARLY FOR ELECTRIC PIN COIL FORMS

The invention relates to a storage tray for semifinished and finished products, especially electrical pin coil-forms with coil-form pins fastened to a coils-form flange, which are utilizable in manufacture as a transport tray for the semifinished products, and as a packaging tray for shipping and storing specific finished products.

It has heretofore been customary for the manufacturer of the electrical pin coil-forms to place the coil forms predominantly on plate-shaped foam materials formed of plastic material such as polystyrene, pack them in cartons, and send them to the customer i.e. the manufacturer of electric coils, in this manner. At the customer's establishment, the pin coil forms were removed from the foam material carriers manually and placed by hand or by means of circular or linear conveyers on a coil-winding machine and, after being wound and soldered, transported assembly facilities via the most varied transport devices and correspondingly adapted storage facilities depending upon the coil manufacturer. The completely assembled electric coils were finally shipped to the storekeeper or ultimate customer packages especially intended for this purpose.

It is an object of the present invention to provide a tray which is suitable for semifinished and finished products and, in particular, for transporting electric pin coil forms from one processing machine to another and, in addition, also for packaging the completely wound and soldered coils. This tray, which can be used as a transport and packing tray, is provided, in addition, for protecting the coil forms i.e. mainly pin coil forms with pointed contact pins, against damage, and especially to prevent the pins thereof from getting bent or broken off, and the coil-form flange thereof from breaking due to improper transport.

With the foregoing and other objects in view, there is provided in accordance with the invention, a tray for semifinished and finished products serving both as a transport tray for the semifinished products as well as a packaging tray for the finished products, including a profiled rail having a tunnel-line cross section with a tunnel floor the side walls, mutually parallel ridge-like supports for the products formed on the tunnel floor in spaced relationship with the side walls, and ridges formed on inner surfaces of the side walls of the profiled rail in spaced relationship with the tunnel floor for securing products, received in the profiled rail with portions thereof disposed between the supports and the ridges, against shifting in direction transverse to the tunnel floor. In effect, the products are thus secured against shifting in the direction of the longitudinal axis of the coil forms.

This tray is equally well suited as packaging for the as-yet unwound coil forms and for the finished coils and replaces, as a work-piece carrier, costly and type-limited feeds and machinery. As practice has shown, the tray, with suitable construction thereof as well as of the feed to the automatic winding machine, can be placed on the latter without the interposition of other elements, so that direct removal of the coil forms afterwards may be effected. Thereby, a costly and non-variable feed system for the coil forms which would otherwise have to precede the automatic winding machine, such as a circular or linear conveyer, is eliminated or dispensed with. The same tray can again receive the already-wound and soldered coil forms i.e. the same tray can also serve as a work-piece carrier between the winding line and the succeeding coil assembly line. After assembly of the coil is completed, the finished coils can likewise be inserted into the same trays and, after being packed in cartons, taken to the shipping department.

In accordance with another feature of the invention, the products are electrical coil forms having longitudinally extending pins at one end thereof, the ridge-like supports being of such height that free end of the coil form pins are disposed spaced from the tunnel floor.

In accordance with a further feature of the invention, the products are electric coil forms having a flange at one end thereof and pins extending longitudinally from the flange, the ridges formed on the inner surfaces of the side walls being disposed at a height from the tunnel floor determined by the length of the pins and the thickness of the flange.

In accordance with an additional feature of the invention, the profiled rail is open in the form of a slot at a side thereof opposite the tunnel floor.

In accordance with an added feature for the invention there is provided a tray for semifinished and finished products serving both as a transport tray for the semifinished products as well as a packaging tray for the finished products, including a profiled rail having a tunnel-like cross section with a tunnel floor and side walls, a pedestal for supporting the products formed on the tunnel floor in spaced relationship with the side walls, and ridges formed on inner surfaces of the side walls of the profiled rail in spaced relationship with the tunnel floor for securing products, received in the profiled rail with portions thereof disposed between the pedestal and the ridges, against shifting in direction transverse to the tunnel floor.

In accordance with yet another feature of the invention, the profiled rail has closable ends.

In accordance with concomitant feature of the invention there is provided an adhesive tape closing off the ends of the profiled ends.

Other features which are considered as characteristic for the invention are set forth in the appended claims.

Although the invention is illustrated and described herein as embodied in a storage tray for semifinished and finished products, particularly for electric pin coil forms, it is nevertheless not intended to be limited to the details shown, since various modifications and structural changes may be made therein without departing from the spirit of the invention and within the scope and range of equivalents of the claims.

Figure 2:
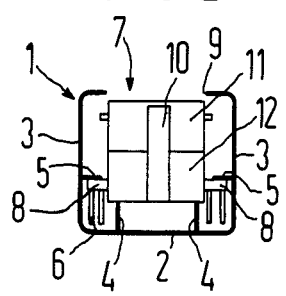

The construction and method of operation of the invention, however, together with additional objects and advantages thereof will be best understood from the following description of specific embodiments when read in connection with the accompanying drawings, in which:

FIG. 1 is a diagrammatic perspective view of a tray according to the invention showing front, lateral and top sides thereof; and FIG. 2 is a front elevational view of FIG. 1 showing the tray together with a completely assembled electric coil therein.

Referring now to the drawing and first, particularly, to FIG. 1 thereof there is shown a tray constructed of a profile rail with a tunnel-like cross section. Formed on the tunnel floor 2 are ridge-shaped mutually parallel supports 4,4 spaced from side walls 3,3 and provided for coil forms or completely assembled electric coils 7 (see FIG. 2). The supports 4,4 can be replaced by a non-illustrated base which is likewise formed on the tunnel floor 2 and spaced from the side walls 3,3. At a distance from the tunnel floor 2 additional ridges 5,5 are formed, preferably integrally, on the lateral inside walls 3,3 of the profiled rail member 1, which have the effect of securing the coil forms or coils 7 against shifting in the direction of the longitudinal axis of the coil.

The height of the ledge or ridge-shaped supports 4,4 is selected so that the free ends of the coil-form pins 6 are arranged at a sufficient distance from the tunnel floor 2, because otherwise, moving the coil forms in longitudinal direction of the tray 1 would not be possible. The height at which the ridges 5, 5 formed on the lateral inner walls 3,3 of the profiled rail 1 are disposed above the tunnel floor 2, is determined by the length of the coil-form pins 6 and by the thicknes of flanges 8 from which they extend. This height is usually selected so that the coil forms or completely assembled coils 7 are pressed against the supports 4 as if under clamping action.

FIG. 2 diagrammatically illustrates a completely assembled electric coil 7 inserted into the tray 1, the coil 7 being formed of chilled core halves 11 and 12 which are held together by an especially resilient clamp. The lateral surface of the profiled rail 1 facing away from the floor 2 of the tunnel may be formed as a closed surface or, as is shown in FIGS. 1 and 2, provided with a slot 9, through which identifying printing possibly located on the top of the coils is readable without having to remove the coil 7 from the tray 1.

For the protection of the coil forms and finished coils 7 inserted into the tray, the end faces of the profiled rail 1 are closed off by non-illustrated adhesive tape.

The foregoing is a description corresponding, in substance, to German application No. P 32 30 075.1, dated Aug. 12, 1982, international priority of which is being claimed for the instant application, and which is hereby made part of this application. Any material discrepancies between the foregoing specification and the specification of the aforementioned corresponding German application are to be resolved in favor of the latter.

The foregoing is a description corresponding, in substance, to German application No. P 32 30 075.1, dated Aug. 12, 1982, international priority of which is being claimed for the instant application, and which is hereby made part of this application. Any material discrepancies between the foregoing specification and the specification of the aforementioned corresponding German application are to be resolved in favor of the latter.

There are claimed:

1. Tray for semifinished and finished products serving both as a transport tray for the semifinished products as well as a packaging tray for the finished products, comprising a profiled rail having a tunnel-like cross section with a tunnel floor and side walls, mutually parallel ridge-like supports for the products formed on said tunnel floor in spaced relationship with said side walls, and ridges formed on inner surfaces of said side walls of said profiled rail and securely fixed in spaced relationship with said tunnel floor and said supports for securing products, received in said profiled rail with portions thereof disposed between said supports and sid ridges, against shifting in direction tranverse to said tunnel floor, said profiled rail being open in the form of a slot at a side thereof opposite said tunnel floor.

2. Tray according to claim 1 wherein the products are electric coil forms having longitudinally extending pins at one end thereof, said ridge-like supports being of such height that free ends of said coil form pins are disposed spaced from said tunnel floor.

3. Tray according to claim 1, wherein the products are electric coil forms having a flange at one end thereof and pins extending longitudinally from said flange, said ridges formed on said inner surfaces of said side walls being disposed at a height from said tunnel floor determined by the length of said pins and the thickness of said flange.

4. Tray according to claim 1 wherein said profiled rail has closable ends.

5. Tray according to claim 4 including adhesive tape closing off said ends of said profiled ends.

* * * * *